US006897526B1

(12) United States Patent
Miyanaga et al.

(10) Patent No.: US 6,897,526 B1
(45) Date of Patent: May 24, 2005

(54) SEMICONDUCTOR DEVICE AND PROCESS FOR PRODUCING THE SAME

(75) Inventors: Akiharu Miyanaga, Kanagawa (JP); Nobuo Kubo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 09/241,695

(22) Filed: Feb. 2, 1999

(30) Foreign Application Priority Data

Feb. 12, 1998 (JP) .......................................... 10-048673

(51) Int. Cl.⁷ .............................................. H01L 29/76
(52) U.S. Cl. ....................... 257/345; 257/339; 257/394; 257/408
(58) Field of Search ............................... 257/394, 396, 257/398, 399, 400, 327, 336, 337, 338, 339, 344, 345, 408; 438/289, 290, 291

(56) References Cited

U.S. PATENT DOCUMENTS

| 4,768,076 A | 8/1988 | Aoki et al. | .................... 357/42 |
| 4,857,986 A | 8/1989 | Kinugawa | .................... 357/42 |
| 4,933,298 A | 6/1990 | Hasegawa | .................... 437/62 |

(Continued)

FOREIGN PATENT DOCUMENTS

| JP | 56060061 A | * 5/1981 | ........... H01L/29/04 |
| JP | 2-153538 | 6/1990 | |
| JP | 5-102180 | 4/1993 | |

OTHER PUBLICATIONS

Son et al., "Comparative Study of Several Anti–Punch–through Designs for Buried Channel PMOSFET," Device Research Conference Digest, Jun. 1997.*
Full English translation re Japanese Patent Application No. JP 5–102180, published Apr. 23, 1993.
Auberton–Herve, A.J., "Industrial Research Society (Kogyo Chosa Kai) ," *Electronic Material*, pp. 83–87, Aug., 1997.
Izumi, K. et al, "C.M.O.S. Devices Fabricated on Buried $SiO_2$ Layer Formed by Oxygen Implantation into Silicon," *Electronics Letters*, vol. 14, No. 18, pp. 593–597, Aug. 31, 1978.
Sakaguchi, K. et al, "Current Progress in Expitaxial Transfer (ELTRAN) ," *IEICE Trans. Electron*, vol. E80 C, No. 3, pp. 378–387, Mar., 1997.
English Abstract re Japanese Patent Application No. JP 2–153538, published Jun. 13, 1990.
English Abstract re Japanese Patent Application No. JP 5–102180, published Apr. 23, 1993.

*Primary Examiner*—Shouxiang Hu
(74) *Attorney, Agent, or Firm*—Cook, Alex, McFarron, Manzo, Cummings & Mehler, Ltd.

(57) ABSTRACT

To provide a semiconductor device that can effectively suppress the short channel effect without deterioration of carrier migration, an impurity ion is added from a direction of the <110> axis with respect to a silicon substrate on forming a punch through stopper under the gate electrode. In this invention, because the addition of the impurity is conducted by utilizing the principal of channeling, the impurity can be added a small amount of scattering suppressing damages on the surface of the silicon substrate. A channel forming region having an extremely small impurity concentration and substantially no crystallinity disorder is formed.

20 Claims, 7 Drawing Sheets

U.S. PATENT DOCUMENTS

| | | | |
|---|---|---|---|
| 4,993,298 A | | 2/1991 | Chamulak et al. ............. 83/698 |
| 5,146,291 A | | 9/1992 | Watabe et al. ............. 357/23.4 |
| 5,217,913 A | | 6/1993 | Watabe et al. ................. 437/44 |
| 5,563,928 A | * | 10/1996 | Rostoker et al. ............... 377/20 |
| 5,643,826 A | | 7/1997 | Ohtani et al. .................. 437/88 |
| 5,650,340 A | * | 7/1997 | Burr et al. ................... 438/286 |
| 5,686,321 A | * | 11/1997 | Ko et al. ....................... 437/29 |
| 5,793,073 A | | 8/1998 | Kaminishi et al. .......... 257/254 |
| 5,818,076 A | | 10/1998 | Zhang et al. ................ 257/255 |
| 5,854,123 A | | 12/1998 | Sato et al. ................... 438/507 |
| 5,854,509 A | | 12/1998 | Kunikiyo ..................... 257/506 |
| 5,877,070 A | | 3/1999 | Goesele et al. .............. 438/458 |
| 5,882,987 A | | 3/1999 | Srikrishnan .................. 438/458 |
| 5,893,740 A | * | 4/1999 | Chang et al. ................ 438/289 |
| 5,899,711 A | | 5/1999 | Smith .......................... 438/162 |
| 5,923,962 A | | 7/1999 | Ohtani et al. ................ 438/150 |
| 5,926,712 A | * | 7/1999 | Chen et al. .................. 438/291 |
| 5,945,972 A | * | 8/1999 | Okumura et al. ............. 345/98 |
| 5,949,107 A | | 9/1999 | Zhang ......................... 257/347 |
| 6,031,268 A | * | 2/2000 | Hiroki et al. ................ 257/345 |
| 6,083,794 A | * | 7/2000 | Hook et al. ................. 438/286 |
| 6,093,951 A | * | 7/2000 | Burr ............................ 257/408 |

* cited by examiner

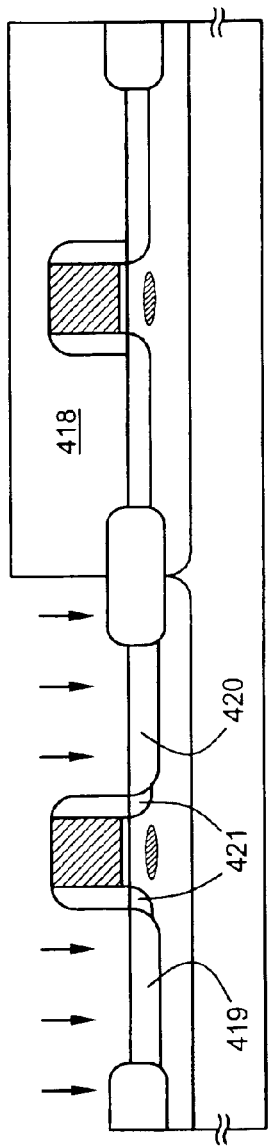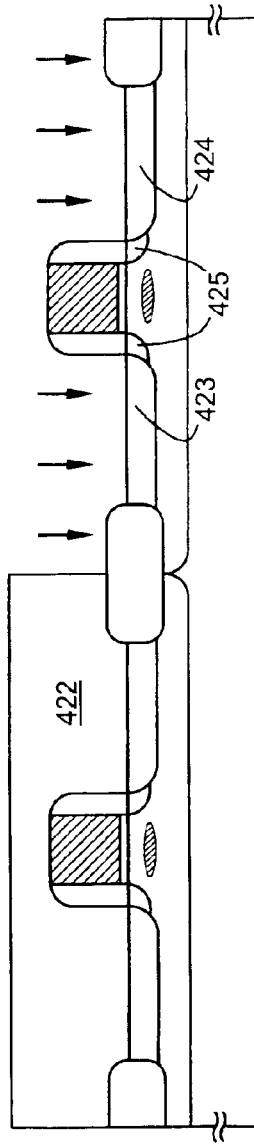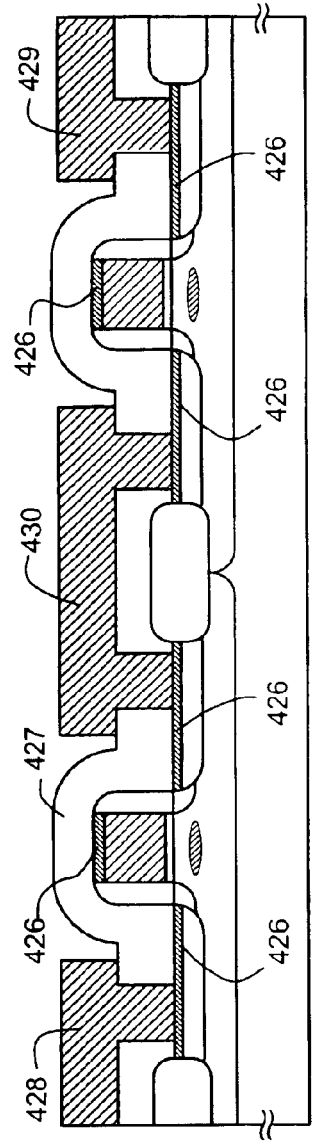

SEMICONDUCTOR DEVICE AND PROCESS FOR PRODUCING THE SAME

FIELD OF THE INVENTION

The present invention relates to a semiconductor device formed by using a single crystal silicon substrate, and particularly relates to a constitution of an insulated gate field effect transistor (also known as a MOSFET or IGFET). The invention is a technique exhibiting its effect particularly in producing a fine device having a channel length of 0.3 $\mu$m or less (typically from 0.05 to 0.2 $\mu$m).

The present invention can be applied to various semiconductor circuits, such as IC, VLSI and ULSI, constituted by integrating MOSFETs.

BACKGROUND OF THE INVENTION

A MOSFET conducts on-off control of an electron flow or a hole flow between a source and a drain by changing the potential at a semiconductor (silicon) interface directly under a gate by a gate voltage.

However, when the channel length of the transistor is shortened, the space charge regions (also known as depletion layers) in the vicinity of the source and the drain come into contact with each other. At this time, the voltage of the semiconductor interface near the gate can be controlled by the gate voltage. However, even when the gate voltage is lowered, the voltage at the part of large depth from the gate stays high due to the influence of the drain voltage.

In other words, when the gate voltage is made 0 V to turn off the transistor, current flows through a part having a high potential (a part to which the space charge region spreads) in the semiconductor substrate. This is known as a short channel effect, which appears as a phenomena, such as an increase in S value (subthreshold coefficient) or a decrease in threshold voltage.

An example of a phenomenon largely contributed by the short channel effect, is a punch through, in which current is kept flowing. The advantage of the miniaturization of a MOSFET is that it can be operated at a low voltage at a high speed. In order to succeed in realizing such miniaturization, suppression of the short channel effect and lowering of the resistance when the transistor is turned on become the important factors.

One example of a method for miniaturizing a MOSFET with suppressing the short channel effect is the scaling method developed by Dennard in 1976 which is well known. It is understood from this method that the following measures are effective to shorten the gate length with suppressing the short channel effect. (1) The gate insulating film is made thin. (2) The source/drain junction depth is made small. (3) The width of the space charge region (depletion layer) is suppressed.

With respect to the item (1), the lower limit is 3 nm under present circumstances. With respect to the item (2), improvement of an ion doping apparatus and the use of laser doping have been investigated, but there still are various problems in a deep submicron size or less.

As for the method for the item (3), it is thought to increase the concentration of the channel forming region, i.e., channel doping. However, in order to produce a MOSFET with a fine dimension such as a wiring design rule of 0.18 $\mu$m, about $1 \times 10^{18}$ atoms/cm$^3$ of an impurity should be added, which becomes a factor of largely decreasing the on current.

The structure shown in FIG. 2 has been known to avoid such a phenomenon. In FIG. 2, numeral 201 denotes a source region, 202 denotes a drain region, 203 denotes an LDD region, and 204 denotes a gate electrode. An impurity region (punch through stopper) 205 having an opposite conductive type to the source/drain is formed under the gate electrode at a large depth. In this structure, the broadening of depletion layer from the drain side is suppressed by the punch through stopper 205 to prevent the short channel effect.

The formation of the punch through stopper 205 shown in FIG. 2 is accomplished adding an impurity ion to the silicon substrate. At this time, the impurity ion to be added is added from the upper side of the silicon substrate, but some problems still exist.

The first problem is that when the impurity ion is added from the upper side of the silicon substrate, the crystallinity of the region at which the channel is formed, i.e., the crystallinity of the vicinity of the surface of the silicon substrate, is broken by the collision ions.

An improvement is recently conducted in that since the depth of the formation of the punch through stopper is small, the impurity ion is added at a small depth by lowering the acceleration voltage for addition of the ion or by adding a compound having a large mass number.

However, both of these methods lead to conditions that are liable to damage on the silicon substrate. Further, it is expected that the disorder of the crystallinity in the vicinity of the surface of the silicon substrate becomes a severe problem with the miniaturization of the device. Such disorder of the crystallinity is not always completely recovered by an annealing treatment.

The second problem is that the impurity ion remains in the area where the channel is formed through the process of injecting the impurity ion into the silicon substrate.

The impurity ion added has a concentration distribution in the depth direction depending on the addition conditions. Therefore, when the addition conditions are set in such a manner that the peak value of the impurity concentration is arranged at the position at which the punch through stopper is formed, the tail part of the concentration profile is broadened toward the vicinity of the surface of the silicon substrate.

When the impurity ion is added from right above of the silicon substrate, the tail part of the profile unavoidably remains at the vicinity of the surface of the silicon substrate. The impurity thus remains in the area where the channel is formed even at a lower value than the peak value.

The disorder of crystallinity and the presence of the impurity described above disturb the migration of the carrier, which results in various problems, such as lowering of the on current (the drain current when the FET is in an on state) and lowering of the mobility (field effect mobility).

As described in the foregoing, although the structure having the punch through stopper exhibits an effect on suppression of the short channel effect, it is expected that the problems of lowering of the on current and the mobility again arise with miniaturization.

SUMMARY OF THE INVENTION

The present invention has been developed in view of the problems described above. An object of of the present invention is to provide a MOSFET that can effectively suppress the short channel effect without deterioration of the mobility of the carrier.

The present invention includes using a technique utilizing anisotropy of ion addition to a silicon substrate (channeling).

Its characteristic feature resides in adding impurity ion give from the angle that is the most difficult to give damage to the silicon substrate.

The angle is the direction perpendicular to the {110} face, i.e., the <110> axis. Silicon has the smallest atom density on the {110} face, and by adding an impurity ion from the <110> axis, the impurity ion can be added to the deeper position with little damage.

The characteristic feature of the present invention resides in the fact that the short channel effect is suppressed by using a technique utilizing the principal of channeling. Accordingly, the formation process of the punch through stopper is conducted by utilizing the principal of channeling, the short channel effect is suppressed, and at the same time, the damage in the vicinity of the surface of the silicon substrate (a range from the surface of the silicon substrate to the depth of 10 nm) and the impurity ion concentration in the vicinity is lowered.

Because the punch through stopper suppressing the short channel effect and the inverted layer (channel region) to be a migration path of the carrier are substantially separated from each other, the concentration of the impurity present in the channel is reduced, and the resistance on the on state becomes small, which results in improved mobility.

Since the impurity ion is added from the <110> direction, the impurity ion is basically added to the silicon substrate from a slanting direction. Therefore, even when a gate electrode is formed on the channel forming region, it is easy to form the punch through stopper under the gate electrode. The gate electrode rather protects the vicinity of the surface of the silicon substrate, and the effect of the present invention can be conspicuously obtained.

As the impurity added as the punch through stopper, an impurity having a conductive type inverse to the source/drain region is preferred. Therefore, in the case of an N-channel type FET, elements selected from the group 13 (typically boron, gallium and indium), and in the case of a P-channel FET, elements selected from the group 15 (typically phosphorous, arsenic and antimony) may be used.

The method for adding a impurity ion may be any one of the ion implantation method, a plasma doping method as a laser doping method. The ion species to be added may be a simple element or a compound.

BRIEF DESCRIPTION OF THE DRAWINGS

FIGS. 6A, 6B and 6C shown the production process of the MOSFET according to EXAMPLE 2.

DETAILED DESCRIPTION OF THE EMBODIMENTS

Embodiments of the present invention are described below with reference to specific examples.

EXAMPLE 1

Figure 1A:
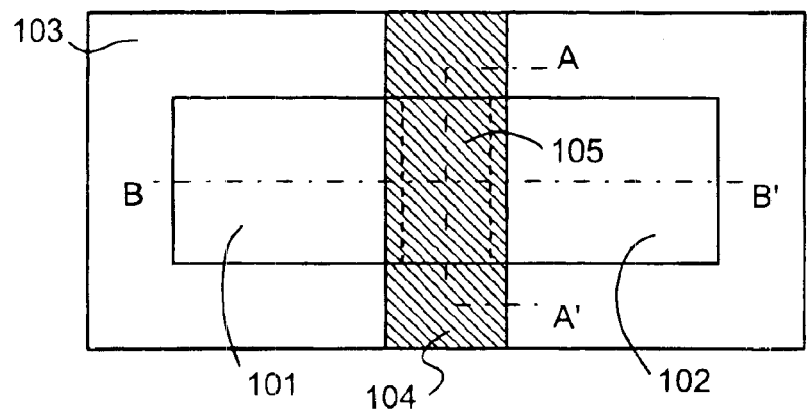
FIGS. 1A, 1B and 1C illustrates the structure of the MOSFET according to EXAMPLE 1.
Figure 1B:
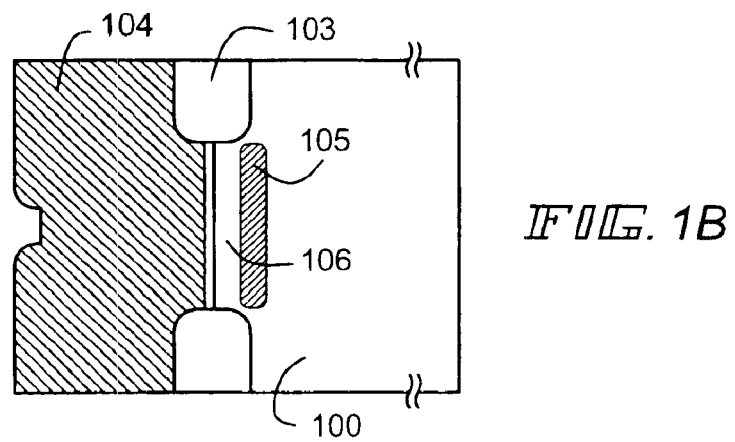
Figure 1C:
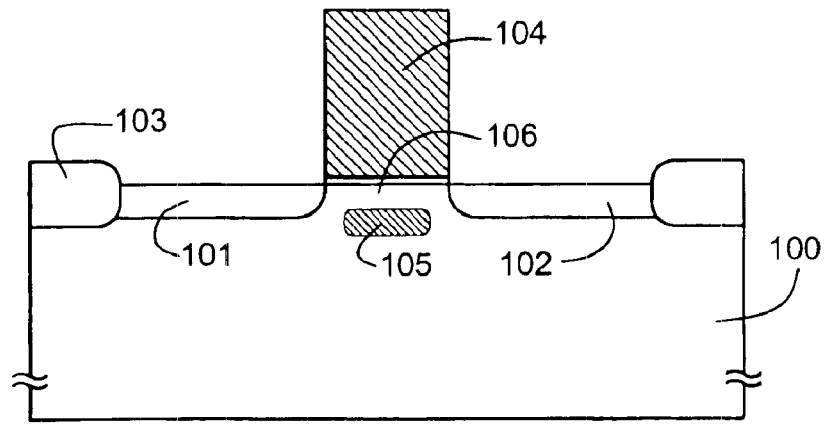
Figure 2:
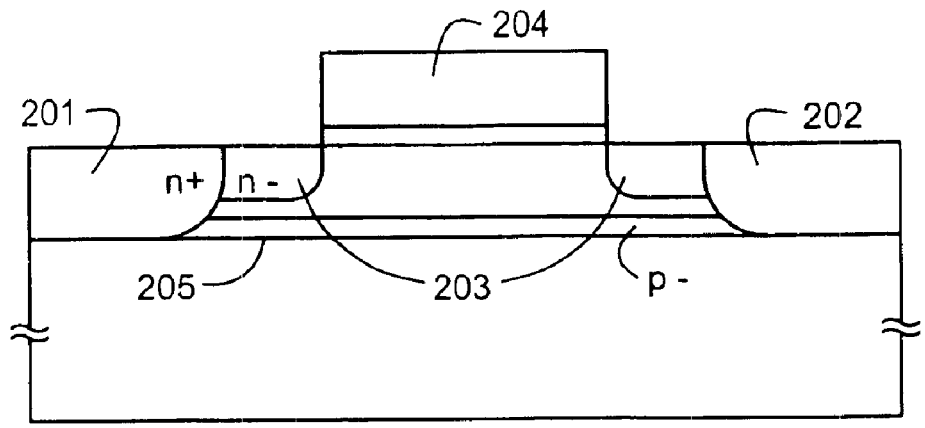
FIG. 2 illustrates the structure of the conventional MOSFET

A part of the constitution of a MOSFET according to the present invention is shown in FIGS. 1A, 1B and 1C (source/drain electrodes are omitted from the figure). FIG. 1A is a plan view, FIG. 1B is a cross sectional view taken on the line A–A' in FIG. 1A, and FIG. 1C is a cross sectional view taken on the line B–B' in FIG. 1A.

In FIGS. 1A, 1B and 1C, numeral 101 denotes a source region, 102 denotes a drain region, 103 denotes a field oxidized film, and 104 denotes a gate electrode. While only the source region 101 and the drain region 102 are described herein, they include high resistance regions, such as a LDD region and an offset region.

An impurity region 105 formed embedded under the gate electrode 104 is the punch through stopper, and a semiconductor region 106 positioned above the same is the channel forming region. The channel forming region used herein designates a region, in which the inverted layer (channel) can be formed. That is, the range of a depth from the surface of the silicon substrate of 10 nm or less is called the channel forming region.

It is preferred that the punch through stopper 105 is not in contact with the source region 101 and the drain region 102. By taking such a configuration, the electric field concentration at the junction part, at which the punch through stopper and the source/drain region are in contact with each other, can be prevented, and the reliability of the MOSFET can be improved, as shown in FIG. 1C.

In FIG. 1B, numeral 100 denotes a single crystal silicon substrate, which may be P type or N type. Because the short channel effect is suppressed by the punch through stopper 105 in the present invention, when the silicon substrate is used as the channel forming region, the substrate concentration can be suppressed as low as $1\times10^{17}$ atoms/cm$^3$ or less(typically from $1\times10^{16}$ to $5\times10^{17}$ atoms/cm$^3$).

Since the production of a silicon wafer having a substrate concentration of $1\times10^{16}$ atoms/cm$^3$ or less requires a concentration controlling technique of high precision, it is not preferred in cost. In the present invention, it is enough that the substrate concentration is lowered to about $1\times10^{16}$ atoms/cm$^3$.

When an impurity is present in the channel forming region, the mobility is lowered due to impurity scattering of the carrier, and it does not become a factor of the impurity scattering when the impurity concentration is $1\times10^{17}$ atoms/cm$^3$ or less. Therefore, in th invention, the addition process of the impurity ion is conducted under the conditions in that the substrate concentration becomes is $1\times10^{17}$ atoms/cm$^3$ or less.

While the structure where the single crystal silicon substrate 100 is utilized as the channel forming region by itself is exemplified in FIG. 1, a MOSFET utilizing the present invention may be formed on an N type as or P type well. In this case, the well concentration may be $1\times10^{17}$ atoms/cm$^3$ or less (typically from $1\times10^{16}$ to $1\times10^{17}$ atoms/cm$^3$). The punch through stopper is of course formed from an impurity having the same conductive type as the well.

The suitable impurity concentration for forming the punch through stopper 105 varies depending on the substrate concentration (or the well concentration), and is typically adjusted to a concentration of from $1\times10^{18}$ to $1\times10^{19}$ atoms/cm$^3$ (preferably from $1\times10^{18}$ to $3\times10^{18}$ atoms/cm$^3$).

When it is less than the concentration of $1\times10^{18}$ atoms/cm$^3$, the effect of the punch through stopper is too weak, and when it is more than $1\times10^{19}$ atoms/cm$^3$, the device cannot function as a MOSFET. In order to normally operate the device, it is preferably $3\times10^{18}$ atoms/cm$^3$ or less taking a margin into consideration.

The formation depth of the punch through stopper is preferably a similar level as or slightly deeper than the junction depth of the source/drain region. Specifically, taking the junction depth of the source/drain region with the channel length of from 0.05 to 0.35 μm into consideration, it is considered that the punch through stopper is preferably formed at a depth of from 20 to 150 nm (preferably from 30 to 80 nm) from the surface of the silicon substrate.

On the other hand, when the junction depth of the source/drain region is 100 nm or less, the concentration difference between the punch through stopper and the channel form region formed thereon becomes extremely small by the conventional formation process of the punch through stopper, as described above. Thus, an extremely large amount of an impurity is conventionally present in the channel to be a migration path of the carrier, which results in the impurity scattering of the carrier and lowering of the on current and the mobility.

In the present invention, however, the impurity ion is added from the <110> direction of the silicon substrate to form the punch through stopper, the ion scattering on the addition of the impurity ion less occurs. That is, the damage on the surface of the silicon substrate on the formation of the punch through stopper, and the diffusion of the impurity ion in the surroundings of the punch through stopper can be minimized.

Figure 3:
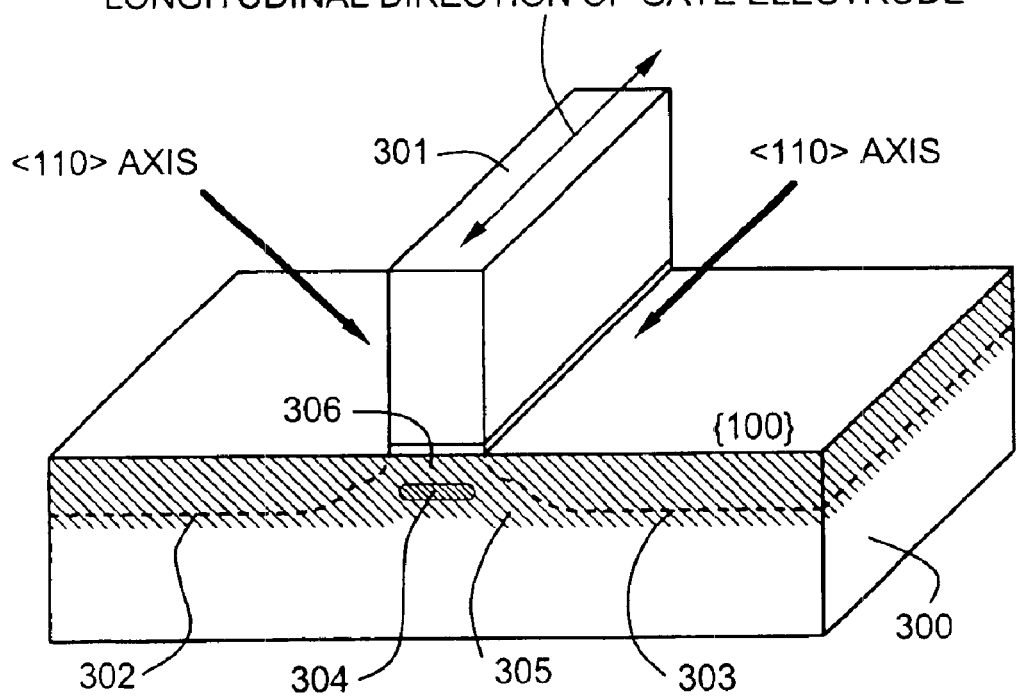
FIG. 3 shows the addition process of an impurity ion of EXAMPLE 1.

The process of the addition of the impurity ion is described with reference to FIG. 3. FIG. 3 is a perspective view of the device forming region surrounded by a field oxidized film (not shown in the figure). In this example, the gate electrode is formed, and then the punch through stopper is formed.

In FIG. 3, numeral 300 denotes a single crystal silicon substrate of {100} orientation, and 301 denotes a gate electrode. It may be, of course, a structure where a well region is provided on the silicon substrate 300, and the gate electrode 301 is formed thereon. The dotted lines 302 and 303 denote regions to become a source/drain region (including an LDD region) later.

Under these circumstances, an impurity ion is added from the direction corresponding to the <110> axis with respect to the silicon substrate 300. As shown in FIG. 3, it is preferred that the gate insulating film is removed by using the bottom of the gate electrode as a mask, to expose the surface of the silicon substrate. When the gate insulating film is present on the surface of the silicon substrate to which the impurity is added, the impurity is scattered at the gate insulating film, and the principal of channeling cannot be effectively utilized.

In the case where the film thickness of the gate insulating film is as thin as 10 nm or less, the addition of the impurity can be conducted with channeling through the gate insulating film by optimizing the addition conditions, for example, using a high acceleration voltage.

It is preferred to design the device in such a manner that the addition direction of the impurity ion is perpendicular to the longitudinal direction of the gate electrode 301. Accordingly, the design of the device is conducted in such a manner that with respect to the silicon substrate of {100} orientation, the direction of the <100> axis within the {100} plane agrees to the direction connecting the source and the drain (the longitudinal direction of the channel). Thus, the impurity ion is added from the direction perpendicular to the longitudinal direction of the gate electrode, and the impurity ion is uniformly added to the area under the gate electrode.

In the case where the silicon substrate used is one exhibiting an orientation plane other than the {100} orientation, for example the {111} orientation, the addition of the impurity ion from the direction of the <100> axis is not always suitable. The important concept of the present invention is that the impurity ion is added from the direction perpendicular to the plane of the silicon substrate, at which the atomic density is the smallest.

As shown in FIG. 3, the impurity ion is preferably added in a symmetric form with respect to the gate electrode. Accordingly, in the part under the gate electrode 301, the concentration profiles of the impurity ions added from the both sides of the gate electrode 301 overlap each other, to locally form a part or area having a high concentration. In this example, such a part is utilized as the substantial punch through stopper.

While the impurity ion is added from the two directions along the <110> axis in FIG. 3, a constitution can be employed in that the impurity ion is also added from other directions, as far as the directions are along with the <110> axis.

By the addition of the impurity ion, the first impurity region 304 and the second impurity region 305 are formed. While the impurity concentration actually has a profile continuously changing, it is schematically shown by roughly dividing into first and second regions for simplifying the description.

The first impurity region 304 is a region formed by overlapping the concentration profiles of the impurity ion symmetrically added from both sides of the gate electrode, which substantially functions as the punch through stopper.

The second impurity region 305 is an impurity region formed by the impurity scattering on the addition of the ion and the leap, and a key point of the present invention is to suppress this region as small as possible. Most of the region is inverted by the impurity ion having the inverse conductive type on the formation of the source/drain region 302 and 303.

In the vicinity of the first impurity region 304 that does not become the source/drain region, the concentration of the impurity ion added is small since it is behind the gate electrode 301, and there is the impurity in a concentration substantially equal to the substrate concentration (or the well concentration).

Particularly, in the range denoted by 306 within the depth of 10 nm or less from the surface of the silicon substrate, and because it is completely behind the gate electrode 301, it is hard to suffer damage from collision ions on the addition of the ion, and the concentration of the impurity ion added is ⅕ or less (typically 1/10 or less, preferably 1/100 or less) of that of the first impurity region 304.

Because the punch through stopper is formed in the manner described above in the present invention, the region where the carrier dominantly migrates (channel forming region 106) and the region suppressing the depletion layer (punch through stopper 105) can substantially be separated, as shown in FIGS. 1B and 1C.

Specifically, when the impurity concentration in the punch through stopper is from $1\times10^{18}$ to $3\times10^{18}$ atoms/cm$^3$, the impurity concentration in the channel forming region can be $1\times10^{17}$ atoms/cm$^3$ or less (typically from $1\times10^{16}$ to $5\times10^{16}$ atoms/cm$^3$). Accordingly, the concentration of the impurity contained in the channel forming region (which has the same conductive type as the impurity contained in the punch through stopper) is lowered to the range of from $\frac{1}{100}$ to $\frac{1}{10}$ of the concentration of the impurity contained in the punch through stopper.

In the conventional technique, on the other hand, the impurity concentration in the channel forming region is the same level as or about ½ of that of the punch through stopper (from $5\times10^{17}$ to $1\times10^{18}$ atoms/cm$^3$).

In the practical application in some cases, an impurity ion for controlling the threshold voltage is added to the channel forming region, the concentration of the impurity finally contained in the channel forming region in the present invention is certainly lower than that in the conventional technique. It has been found as a result of simulation that the concentration of the impurity for forming the punch through stopper in the channel forming region in the present invention is smaller than that in the conventional technique by about one order.

In the present invention, the impurity concentration in the channel forming region can be lowered to the similar level as the substrate concentration (or the well concentration). Since damage on the addition of the ion do not remain in the channel forming region, the mobility of the MOSFET is not lowered, and high speed operation can be conducted.

As described above, an important constitution of the present invention is that the impurity ion is added from the <110> direction with respect to the silicon substrate. As a result of the simulation conducted by the inventors, when the deviation (fluctuation) from the <110> axis 3° or less (preferably 2° or less), a similar effect as when the addition is conducted from the <110> axis can be obtained.

For example, taking a single crystal silicon substrate exhibiting the {100} plane as an example, and by inclining the <100> axis present within the substrate plane at 45°, it agrees to the <110> axis. Therefore, when this inclination falls within the range of 45±3° (preferably 45±2°) a similar effect as the addition is conducted from the <110> axis an be obtained.

In the conventional technique for forming the punch through stopper, the impurity ion has been added at the direction inclined by 7° from the direction perpendicular to the substrate plane. That is, the impurity ion has been added near the right angle with respect to the substrate. Therefore, there has been no concept of forming the punch through stopper by utilizing the channeling as in the present invention.

In the MOSFET of the present invention, since the device size can be miniaturized with suppressing the short channel effect, high operation performance can be realized while maintaining high reliability. Furthermore, since any unnecessary impurity is not added to the region, through which the carrier migrates, a MOSFET having high mobility can be realized.

EXAMPLE 2

An example, where a CMOS circuit is constituted by using the MOSFET according to the present invention having the structure shown in Example 1, is described with reference to FIGS. 4A, 4B, 4C, 5A, 5B, 5C, 6A, 6B and 6C.

A P type single crystal silicon substrate of {100} orientation is prepared, and a P type well 402 and an N type well 403 are formed by injecting an impurity ion. This structure is the so-called twin tab structure, which is formed with a well concentration of from $1\times10^{16}$ to $5\times10^{17}$ atoms/cm$^3$, as shown in Example 1.

Figure 4A:
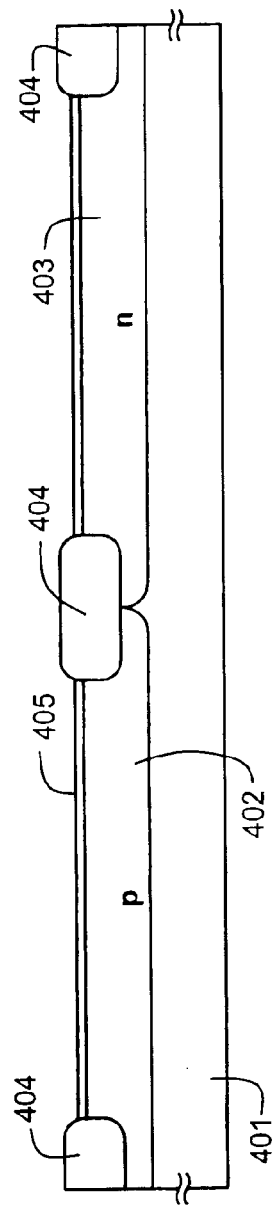
FIGS. 4A, 4B and 4C show the production process of the MOSFET according to EXAMPLE 2.

Selective oxidation is conducted, for example, by the known LOCOS method, to form a field oxidized film 404. Then an oxidized film (to be a gate insulating film) 405 having a thickness of 30 nm is formed on the surface of the silicon substrate by a heat oxidation process. (FIG. 4A)

Gate electrodes 406 and 407 are then formed. In this example, a silicon film having conductivity is used as a material constituting the gate electrode, and a conductive film of tantalum, chromium, tungsten and molybdenum may also be used for the gate electrode. In this example, the width of the gate electrode is 0.18 µm.

After forming the gate electrodes, the region to be a P type channel MOSFET (right side of the figure) is covered with a resist mask 408, and under the circumstances, boron is added to the silicon substrate 401 from the direction of the <110> axis. (FIG. 4B)

Actually, the arrangement and design of the device is conducted in such a manner that the direction parallel to the paper plane becomes the <100> axis, and the addition is conducted from the diagonal direction of 45°, so as to realize the addition of the impurity from the <110> axis. In the present invention, sufficient effects can be obtained when angle falls within the range of 45±3° (preferably 45+2°).

In this example, a punch through stopper 409 having a peak concentration of $1\times10^{18}$ atoms/cm$^3$ is formed by the ion implantation method. The injection gas is BF$_2$, the accelerated voltage is 10 keV, and the dose amount is $1\times10^{13}$ atoms/cm$^2$.

Figure 4B:
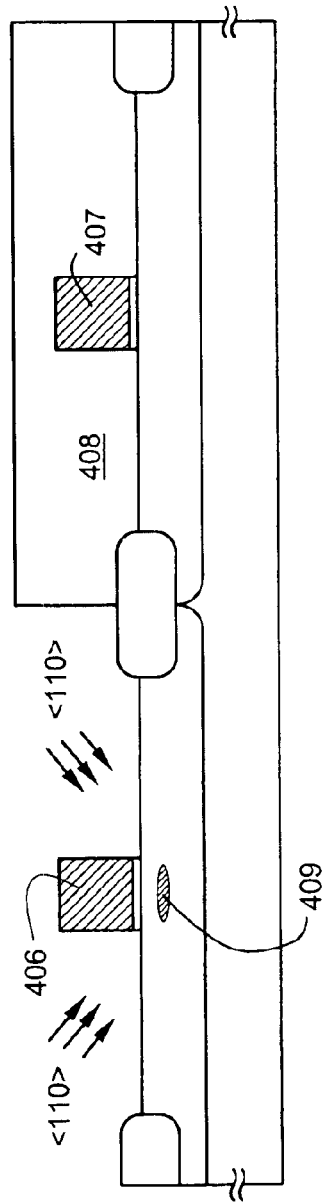

In FIG. 4B, only the part that functions substantially as the punch through stopper is shown. The indication of weak impurity regions formed surrounding the punch through stopper is omitted.

Arsenic is then added to the silicon substrate from the substantially perpendicular direction. The addition conditions are adjusted, so that the concentration of arsenic falls within the range of from $5\times10^{18}$ to $1\times10^{19}$ atoms/cm$^3$. In order to form a shallow junction of from 20 to 40 nm in this example, either the ion implantation method, the plasma doping method or the laser doping method is employed.

Figure 4C:
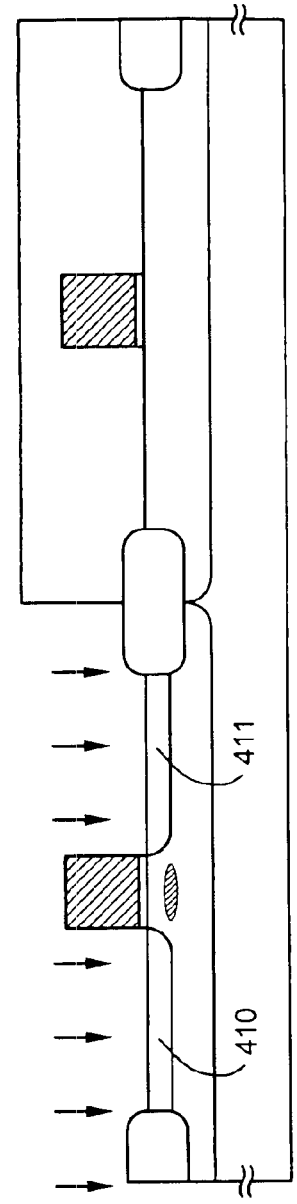

A part of impurity regions 410 and 411 (the edge part in contact with the channel forming region) will function as a LDD (lightly doped drain) region of the N channel type MOSFET. (FIG. 4C)

The region to be the N channel type MOSFET is covered with a resist mask 412. After forming the resist mask 412, phosphorous is added to the silicon substrate from the direction of the <110> axis, to form the punch through stopper 413.

Figure 5A:
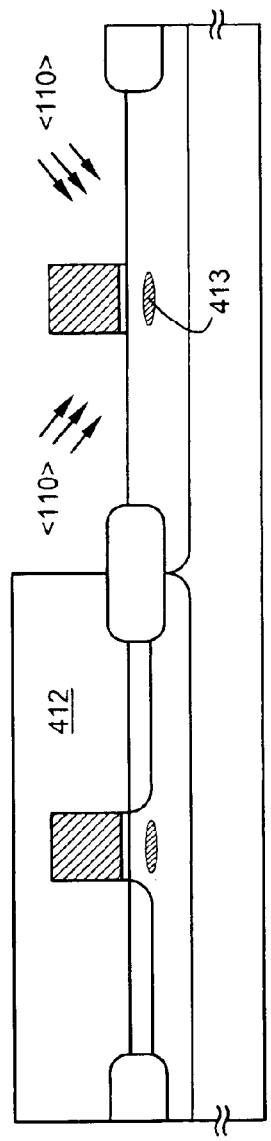
FIGS. 5A, 5B and 5C shown the production process of the MOSFET according to EXAMPLE 2.

In this example, the peak concentration is adjusted to $1\times10^{18}$ atoms/cm$^3$ by the ion implantation method. The injection gas is PH$_3$, the accelerated voltage is 10 keV, and the dose amount is $1\times10^{13}$ atoms/cm$^2$. (FIG. 5A)

Boron is added to the silicon substrate from the perpendicular direction, to form impurity regions 414 and 415, which will function as ap LDD region of the P channel type MOSFET. In this case, it is also preferred to form a shallow junction. (FIG. 5B)

Figure 5B:
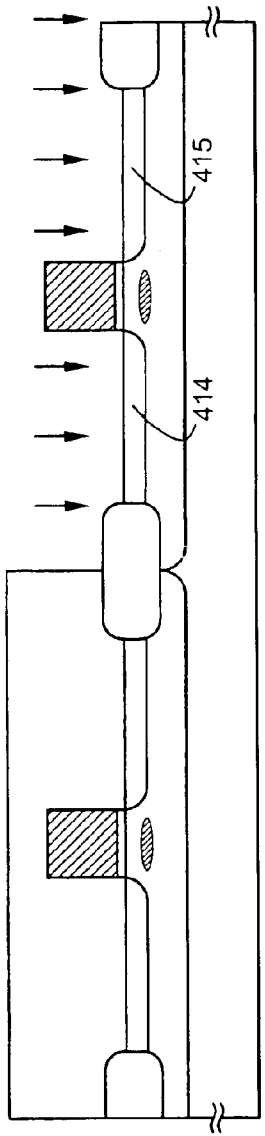
Figure 5C:
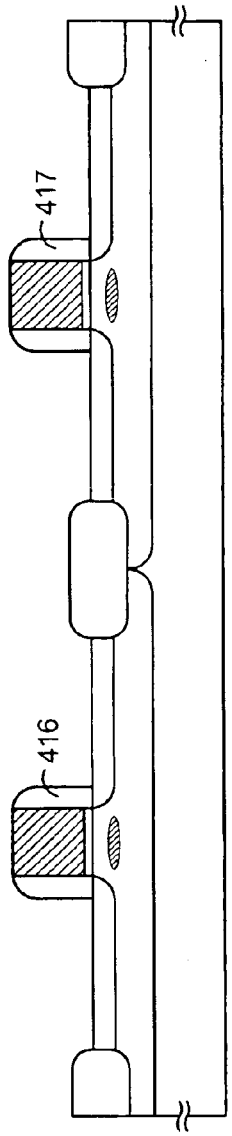

After obtaining the state shown in FIG. 5B, a silicon oxide film (not shown in the figure) is accumulated to conduct etch back, so as to form side walls 416 and 417. (FIG. 5C)

The region to be the P channel type MOSFET is again covered with a resist mask 418, and arsenic is added in a concentration of $1\times10^{20}$ atoms/cm$^3$. A source region 419 and a drain region 420 are thus formed, and an LDD region 421 is formed under the side wall 416. (FIG. 6A)

In the case where the source/drain region is formed, it is preferred to form a shallow junction by using either the ion implantation method, the plasma doping method or the laser doping method.

The region to be the N channel type MOSFET is similarly covered with a resist mask 422, and boron is added in a concentration of $1 \times 10^{20}$ atoms/cm$^3$. A drain region 423 and a source region 424 are thus formed, and a LDD region 425 is formed under the side wall 417. (FIG. 6B)

After obtaining the state shown in FIG. 6B, an annealing treatment is conducted by heat or laser, to activate the added impurities. At this time, it is necessary to set the conditions that make the scattering of the impurities as small as possible.

After completing the activation of the source/drain region, a titanium film is formed followed by an annealing treatment, so as to form a titanium silicide layer 426 on the surface of the source/drain region and the gate electrode. A metallic silicide using other metallic films may be formed. After forming the silicide layer, the titanium film is removed.

An interlayer insulating film 427 is formed. Source electrodes 428 and 429 and a drain electrode 430 are formed by making contact holes. It is effective to conduct hydrogenation after forming the electrodes.

After conducting the process described above, a CMOS circuit shown in FIG. 6C is obtained. While in the CMOS circuit, the punch through stoppers are provided for the N channel type MOSFET and the P channel type MOSFET. A constitution where the punch through stopper is also provided for only one of them is possible.

EXAMPLE 3

An example, where a punch through stopper is formed before the formation of a gate electrode, is described with reference to FIG. 7.

Figure 7:
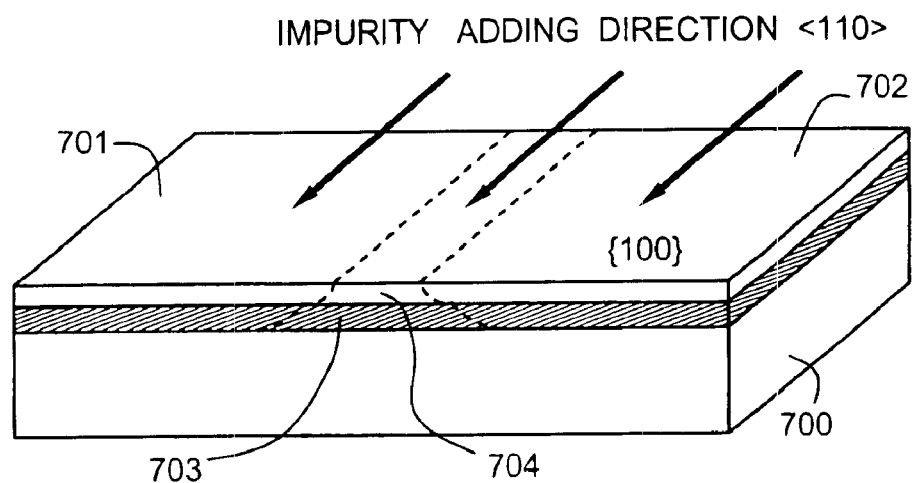
FIG. 7 shows the addition process of an impurity ion of EXAMPLE 3.

In FIG. 7, numeral 700 denotes a silicon substrate, 701 denotes a region, at which a source region will be formed, (indicated as a source region in the figure), and 702 denotes a region, at which a drain region will be formed, (indicated as a drain region in the figure). Therefore, the actual situation is that a field oxidized film (not shown in the figure) is formed on the silicon substrate.

Under the circumstances, an impurity ion is added to the silicon substrate 700 from the direction of the <110> axis by the ion implantation method. In this example, the injection gas is BF$_2$, the accelerated voltage is 10 keV, and the dose amount is $3 \times 10^{13}$ atoms/cm$^2$.

In a punch through stopper 703 thus formed, the peak value of the impurity concentration is adjusted to $1 \times 10^{18}$ atoms/cm$^3$, and the concentration peak is present in the form of a belt in the silicon substrate 700 with a depth of from 30 to 100 nm from the surface and a width of from 10 to 20 nm.

A channel forming region 704 positioned in the vicinity of the surface of the silicon substrate suffers less ion collision damage by the principal of channeling, and the impurity ion concentration remaining after the addition of the impurity is as low as the level similar to the substrate concentration (or the well concentration).

The characteristic feature of this example resides in the fact that because the impurity ion is added by utilizing the principal of channeling, damage on the surface of the silicon substrate is extremely small, and the punch through stopper can be formed with the desired depth and the steep concentration profile owing to the small amount of impurity that stays in the vicinity of the surface of the silicon substrate. This effect is the same as in Example 1.

EXAMPLE 4

Figure 8:
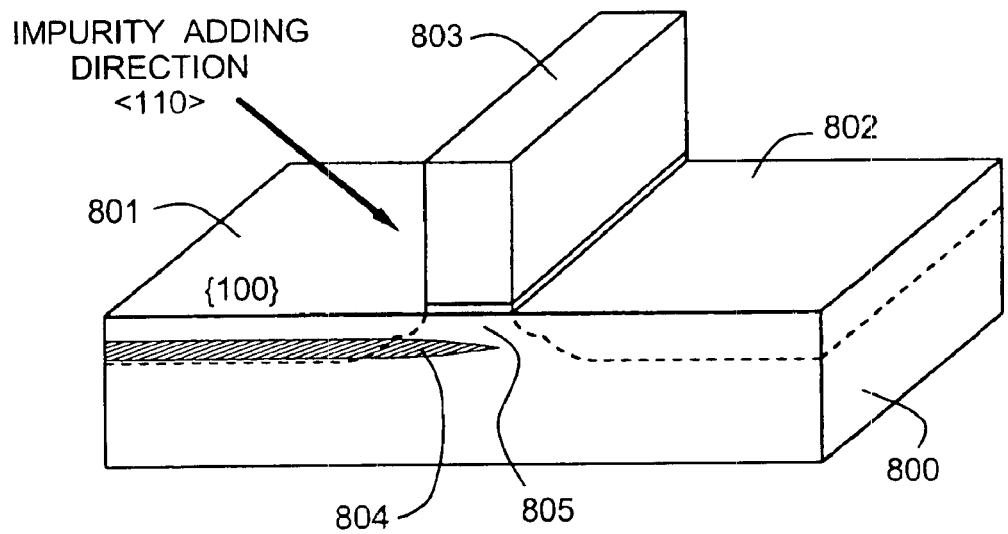
FIG. 8 shows the addition process of an impurity ion of EXAMPLE 4.

An example, where an impurity ion is added from one side of a gate electrode after forming the gate electrode, is described with reference to FIG. 8. In FIG. 8, numeral 800 denotes a silicon substrate, 801 denotes a region, at which a source region will be formed (indicated as a source region in the figure), 802 denotes a region, at which a drain region will be formed, (indicated a drain region in the figure), and 803 denotes a gate electrode.

In Example 1, the impurity ion is added from at least two directions of the <110> axis after forming the gate electrode, as shown in FIG. 3. On the other hand, the characteristic feature of this example resides in the fact that the addition is conducted from only one direction.

In this example, because the impurity ion is added from the side of the region 801, at which a source region will be formed, a punch through stopper 804 is formed in the shape shown in FIG. 8. A channel forming region 805 is substantially separated from the punch through stopper 804, and its crystallinity and impurity concentration before the formation of the punch through stopper can be maintained.

According to the constitution of this example, change of the addition direction on the addition of the impurity ion is not needed, and thus the throughput can be improved. By adding from the source region as in this example, the electric field concentration can be avoided since the punch through stopper 804 and the drain region 802 are not contact with each other.

Furthermore, the punch through stopper 804 in contact with the source region 801 can exhibit an effect in that a hole generated at the junction of the channel forming region 805 and the drain region 802 by impact ionization is withdrawn to the source region. This is effective particularly in the N channel type MOSFET.

EXAMPLE 5

The present invention can be applied to the general fields of IC techniques. Accordingly, it can be applied to all the semiconductor devices (products containing a MOSFET as a part) commercially distributed in the current market. The term "semiconductor device" used herein include not only simple devices, but also an integrated circuit constituted by multiple simple devices, as well as an electronic device (application product) equipped with such an integrated circuit.

For example, the present invention can be applied to a microprocessor integrated on one chip, such as a RISC processor and an ASIC processor. It can also be applied to all integrated circuits utilizing a semiconductor including a signal processing circuit, such as a D/A converter, and a high frequency circuit for a portable potable apparatus (e.g., a cellular phone, a personal handy phone system, and a portable computer).

Figure 9:
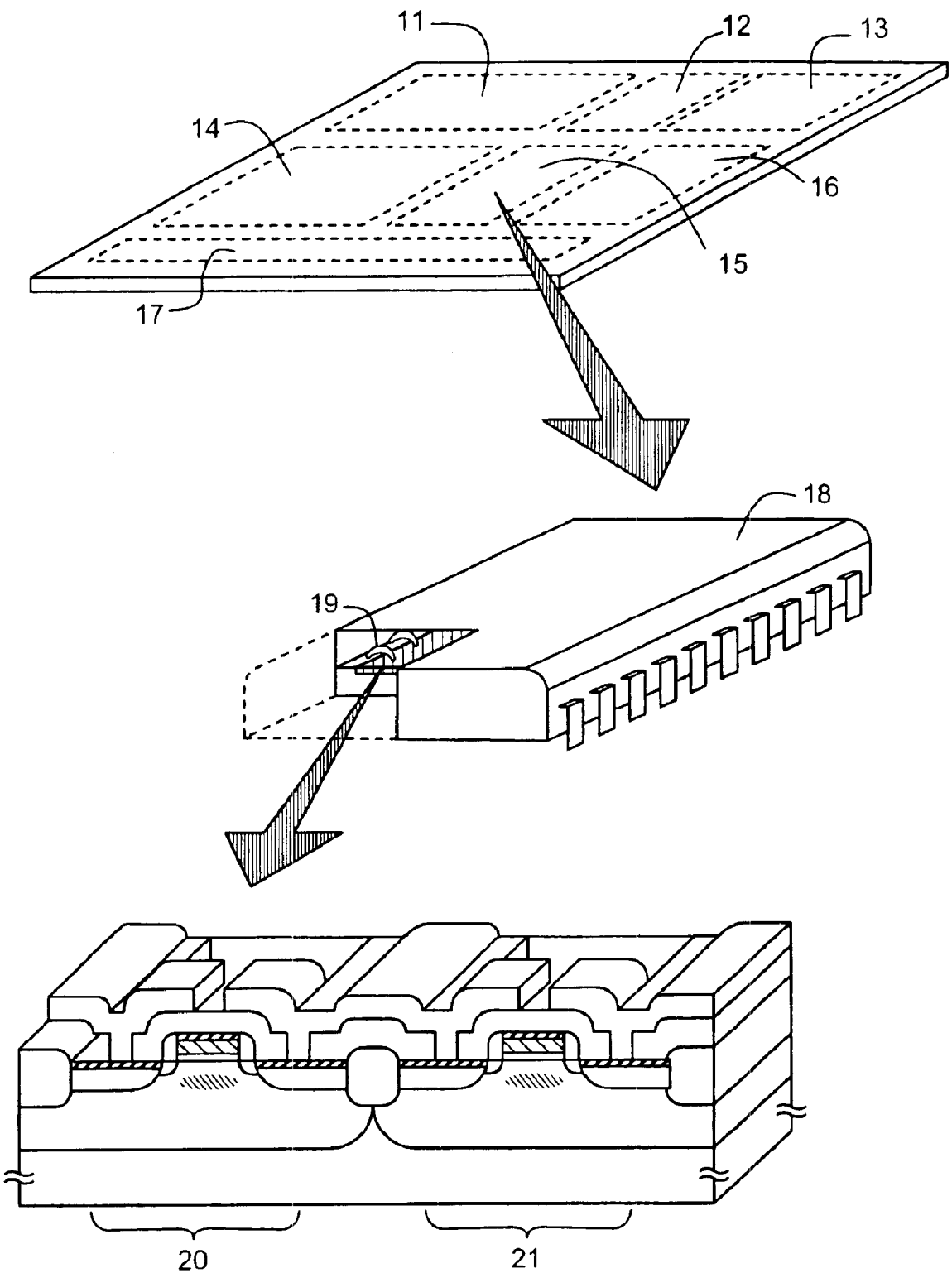
FIG. 9 shows an example of an electronic apparatus of EXAMPLE 5.

An example of a microprocessor is shown in FIG. 9. A microprocessor typically comprises a CPU core 11, a RAM 12, a clock controller 13, a cash memory 14, a cash controller 15, a serial interface 16, an I/O port 17, etc.

The microprocessor shown in FIG. 9 is a simplified model, and various types of circuit design are conducted for an actual microprocessor.

However, in any microprocessor having any function, what functions as the nucleus is an IC (integrated circuit) 18.

The IC 18 is a functional circuit comprising an integrated circuit formed on a semiconductor chip 19 protected with ceramics, etc.

The MOSFETs 20 (N channel type) and 21 (P channel type) having the structure according to the present invention constitute the integrated circuit formed on the semiconductor chip 19. The basic circuit is constituted with a CMOS circuit as the minimum unit, to suppress the consuming electric power.

The microprocessor shown in this example functions as the nucleus circuit by being installed in various electronic apparatuses. Representative examples of the electronic apparatuses include a personal computer, a portable information terminal apparatus, and all home electronic apparatuses. A computer for controlling vehicles (e.g. automobiles and electric trains) is also included.

Furthermore, a semiconductor circuit constituted with a MOSFET utilizing the present invention, and an electro-optical apparatus, such as a liquid crystal display apparatus and an EL display apparatus, operated by the circuit can be produced. Such an electro-optical apparatus can be utilized as a display device of a notebook personal computer, a portable information terminal or a projection display. The term "semiconductor apparatus" used herein includes such an electro-optical apparatus and an electronic apparatus equipped with such an electro-optical apparatus as a display device.

By using the present invention, the impurity concentration in the channel forming region of the MOSFET employing the punch through stopper structure can be lowered in comparison to the conventional technique. By providing the punch through stopper without damage due to ion collision, a channel forming region maintaining an extremely high crystallinity can be obtained.

As a result, the short channel effect is suppressed, and at the same time, the lowering of the on current and the mobility due to the impurity scattering can be prevented. Thus, a MOSFET having both high reliability and high performance can be realized.

By constituting a circuit with a combination of the MOSFETs according to the present invention, a semiconductor apparatus having extremely excellent operation characteristics can be achieved. Therefore, the MOSFET utilizing the present invention can be a substitute for all the semiconductors commercially distributed in the current market, and all the semiconductor devices can have high performance and high reliability.

What is claimed is:

1. A semiconductor device comprising a plurality of MOSFETs formed in a single crystal semiconductor substrate, each of the plurality of MOSFETs comprising:
a source region and a drain region each including a first impurity;
a channel forming region being formed between the source region and the drain region; and
an impurity region including a second impurity having an opposite conductive type to the first impurity and being formed under the channel forming region and in the source region, wherein the impurity region is formed at a depth in a range of 20 to 150 nm from a surface of the single crystal semiconductor substrate, wherein the impurity region is not in contact with the drain region, and wherein a concentration of the second impurity in the channel forming region is from $1/100$ to $1/10$ of that in the impurity region formed under the channel forming region and in the source region.

2. A device according to claim 1, wherein the semiconductor device is an integrated circuit (IC).

3. A device according to claim 1, wherein the semiconductor device is a microprocessor.

4. A device according to claim 3, wherein the microprocessor is at least one selected from the group consisting of a RISC processor and an ASIC processor.

5. A device according to claim 1, wherein the semiconductor device is at least one selected from the group consisting of a cellular phone, a personal handy phone system, and a portable computer.

6. A device according to claim 1, wherein the single crystal semiconductor substrate is a single silicon substrate.

7. A semiconductor device comprising a plurality of MOSFETs formed in a single crystal semiconductor substrate, each of the plurality of MOSFETs comprising:
a source region and a drain region each including a first impurity;
a channel forming region being formed between the source region and the drain region;
an impurity region including a second impurity having an opposite conductive type to the first impurity and being formed under the channel forming region and in the source region;
a pair of LDD regions, wherein one of the pair of LDD regions is formed between the source region and the channel forming region while the other of the pair of LDD regions is formed between the channel forming region and the drain region, wherein the impurity region is formed at a depth in a range of 20 to 150 nm from a surface of the single crystal semiconductor substrate, wherein the impurity region is not in contact with the drain region, and wherein a concentration of the second impurity in the channel forming region is from $1/100$ to $1/10$ of that in the impurity region formed under the channel forming region and in the source region.

8. A device according to claim 7, wherein the semiconductor device is an integrated circuit (IC).

9. A device according to claim 7, wherein the semiconductor device is a microprocessor.

10. A device according to claim 9, wherein the microprocessor is at least one selected from the group consisting of a RISC processor and an ASIC processor.

11. A device according to claim 7, wherein the semiconductor device is at least one selected from the group consisting of a cellular phone, a personal handy phone system, and a portable computer.

12. A semiconductor device comprising at least a CMOS circuit including an n-channel MOSFET and a p-channel MOSFET each being formed in a single crystal semiconductor substrate, said n-channel MOSFET comprising:
a first source region and a first drain region each comprising a first n-type impurity;
a first channel forming region being formed between the first source region and the first drain region;
a first impurity region including a first p-type impurity and being formed under the first channel forming region and in the first source region;
wherein the first impurity region is not in contact with the first drain region, said p-channel MOSFET comprising:
  a second source region and a second drain region each comprising a second p-type impurity;
  a second channel forming region being formed between the second source region and the second drain region;
  a second impurity region including a second n-type impurity and being formed under the second channel forming region;
  wherein each of the first and second impurity regions is formed at a depth in a range of 20 to 150 nm from a surface of the single crystal semiconductor substrate.

13. A device according to claim 12,
  wherein the first n-type impurity is arsenic,
  wherein the second n-type impurity is phosphorus,
  wherein each of the first and second p-type impurity is boron.

14. A device according to claim 12, wherein the semiconductor device is an integrated circuit (IC).

15. A device according to claim 12, wherein the semiconductor device is a microprocessor.

16. A device according to claim 15, wherein the microprocessor is at least one selected from the group consisting of a RISC processor and an ASIC processor.

17. A device according to claim 12, wherein the semiconductor device is at least one selected from the group consisting of a cellular phone, a personal handy phone system, and a portable computer.

18. An EL display device comprising:
  a plurality of MOSFETs formed in a single crystal semiconductor substrate, each of the plurality of MOSFETs comprising:
    a source region and a drain region each including a first impurity;
    a channel forming region being formed between the source region and the drain region; and
    an impurity region including a second impurity having an opposite conductive type to the first impurity and being formed under the channel forming region and in the source region,
  wherein the impurity region is not in contact with the drain region,
  wherein the impurity region is formed at a depth in a range of 20 to 150 nm from a surface of the single crystal semiconductor substrate,
  wherein a concentration of the second impurity in the channel forming region is from $\frac{1}{100}$ to $\frac{1}{10}$ of that in the impurity region,
  wherein the second impurity is introduced from a direction of the <110> axis with respect to the single crystal semiconductor substrate, so that the second impurity is introduced from a perpendicular direction to a plane having the smallest atomic density of the single crystal semiconductor substrate,
  wherein the concentration of the second impurity in the impurity region is in a range of $1 \times 10^{18}$ to $1 \times 10^{19}$ atoms/cm$^3$,
  wherein the concentration of the second impurity in the channel forming region is in a range of $1 \times 10^{16}$ to $1 \times 10^{17}$ atoms/cm$^3$.

19. An EL display device according to claim 18,
  wherein the first impurity is arsenic, and
  wherein the second impurity is phosphorus.

20. An EL display device according to claim 18, wherein the EL display device is incorporated into at least one selected from the group consisting of a cellular phone, a personal handy phone system and a portable computer.

* * * * *